United States Patent [19]
Tong et al.

[11] Patent Number: 5,285,455
[45] Date of Patent: Feb. 8, 1994

[54] SERIAL DATA ENCODER

[75] Inventors: Po Tong, Fremont; Peter A. Ruetz, Redwood City, both of Calif.

[73] Assignee: LSI Logic Corporation, Milpitas, Calif.

[21] Appl. No.: 76,271

[22] Filed: Jun. 11, 1993

Related U.S. Application Data

[63] Continuation of Ser. No. 829,655, Feb. 3, 1992, abandoned.

[51] Int. Cl.⁵ .............................................. G06F 11/00
[52] U.S. Cl. ................................................... 371/37.5
[58] Field of Search ................... 371/37.5, 37.4, 37.7, 371/37.8, 37.1, 38.1, 51.1, 61, 62

[56] References Cited

U.S. PATENT DOCUMENTS 4,680,764 7/1987 Suzuki et al. ...................... 371/37.5
4,777,635 10/1988 Glover ................................ 371/37.5

FOREIGN PATENT DOCUMENTS 2624676 6/1989 France .............................. 371/37.5
0136587 4/1985 Japan ................................ 371/37.5
0140381 5/1985 Japan ................................ 371/37.5
0156413 10/1985 Netherlands ..................... 371/37.5
8202103 6/1982 PCT Int'l Appl. ................ 371/37.5

Primary Examiner—Robert W. Beausoliel, Jr.
Assistant Examiner—Phung M. Chung
Attorney, Agent, or Firm—Townsend and Townsend Khourie and Crew

[57] ABSTRACT

Sequential encoding of Reed-Solomon codes using a discrete time delay line, a single adder, and a single multiplier provides efficient encoding of Reed-Solomon codes with or without interleaving. The encoder utilizes a clock whose rate is r times the symbol rate where r is the redundancy of the code. The finite field operations are performed in a sequential manner requiring only one finite field multiplier and one finite field adder. All memory elements are consolidated into a discrete time delay line which can be implemented with a random access memory. The encoder can be easily reconfigured for changes in generator polynomial of the code, the amount of redundancy, and interleaving depth.

8 Claims, 2 Drawing Sheets

SERIAL DATA ENCODER

This is a continuation of application Ser. No. 07/829,655 filed Feb. 3, 1992 now abandoned.

BACKGROUND OF THE INVENTION

This invention relates generally to the encoding of data for transmission and storage, more particularly the invention relates to the encoding of Reed-Solomon (RS) codes.

The trend towards higher densities and data rates in magnetic data recording has required error control coding and modulation techniques. Error detection and correction coding can use a polynomial with binary coefficients to represent a sequence of binary bits and with a plurality of check bits determined by a coding process which requires that every code word be divisible by a preselected polynomial with zero remainder. A plurality of cyclic codes can be interleaved to form a cyclic code for further error reduction. Further, the binary base field can be extended to a finite field of $2^m$ elements, known as a Galois field GF $(2^m)$ in which all elements are represented by m-bit binary symbols.

The Reed-Solomon (RS) code is based on an extension of the concepts of cyclic codes in an extended binary field GF $(2^M)$. All processing of these polynomials is done using sum and product operations defined in the extension field GF $(2^m)$. In this system, the generator G(z), the information sequence B(z), the remainder C(z), and the code word W(z) are all polynomials whose coefficients are elements in GF$(2^m)$ in the form of m-bit bytes.

An (n,k) Reed-Solomon (RS) code over the finite field FG$(2^m)$ has k message symbols and $r = n - k$ redundant check symbols, where each symbol is m bits wide and $n = r + k$ total code length in symbols. The check symbols $C_{r-1}, C_{r-2}, \ldots, C_1, C_0$ are computed from the message symbols $M_{k-1}, M_{k-2}, \ldots, M_1, M_0$ using the formula $$C(z) = M(z)z^r \text{ modulo } G(z)$$

where $C(z) = C_{r-1}z^{r-1} + C_{r-2}Z^{r-2} + \ldots + C_1z + C_0$ is the check polynomial, $M(z) = M_{k-1}z^{k-2} + \ldots + M_1z + M_0$ is the message polynomial and $G(z) = z^r + G_{r-1}r-1 + G_{r-2}z^{r-2} + \ldots + G_1z + G_0$ is the generator polynomial of the RS code. C(z) is the remainder when $M(z)z^r$ is divided by G(z).

The conventional parallel implementation of a RS encoder is shown in FIG. 1 in which a message and the content of a register are summed and applied through a MUX 10 to a plurality of multipliers 12 which multiply the sum by coefficients, $G_1$, with the products added to contents of registers 14 in adders 16 and then stored in other registers 14.

In this parallel approach, a message symbol is input every clock cycle, and r finite field multiplications (by the r constant coefficients, $G_1$, of the generator polynomial) and r finite field additions are performed every clock cycle. The message select signal is high when message symbols are being input and low when the redundant check symbols are being output. The other signals in FIG. 1 are all m bits wide where m is the number of bits per symbol. In this approach, r constant finite field multipliers 12, r finite field adders 16, and r symbol registers 14 are needed.

Various other RS encoder architectures has been proposed, depending on the required throughput data rate of the application. Using the Cauchy representation of the RS generator matrix, Seroussi has proposed a systolic implementation which is particularly suitable for very high speed implementation in "A Systolic Reed-Solomon Encoder", IEEE Trans. on Information Theory Vol. IT-37, No. 4, p. 1217-1220, July 1991. For lower throughput applications, Berlekamp discloses in "Bit-Serial Reed-Solomon Encoders", IEEE Trans. on Information Theory, Vol. IT-28, No. 6, p. 869-874, November 1982, a bit-serial architecture by exploiting the properties of dual basis representation of finite field elements. Berlekamp's bit-serial architecture assumes the availability of a bit clock whose rate is m times the symbol rate. In comparison to the parallel approach, the complexity of the r constant finite field multipliers and r finite field adders are reduced by a ratio of roughly m:1. Yet another approach is the microcoded sequencer architecture disclosed in U.S. Pat. No. 4,162,480. In this architecture, the throughput data rate is usually limited by the number of memory accesses, and the speed of the memory access cycle.

The present invention is directed to the efficient encoding of Reed-Solomon codes using serial encoding and discrete time delay lines.

SUMMARY OF THE INVENTION

An object of the invention is an efficient Reed-Solomon encoder using serial encoding and method of encoding using the encoder.

Another object of the invention is an RS encoder where memory elements can be consolidated into a discrete time delay line.

Still another object of the invention is an RS encoder which is readily implemented in a semiconductor integrated circuit.

A feature of the invention is the use of a random access memory as a discrete time delay line.

Another feature of the invention is RAM delay line which can be implemented in high-speed operation by appropriate multiplexing and demultiplexing.

Briefly, the encoder in accordance with the invention includes a single multiplier and a single adder for obtaining the quotient or redundant check signals of the polynomial division, depending on whether all message symbols have been inputted to the encoder. The intermediate results of the computation are fed back to the discrete time delay line, controlled by a feedback control signal. The discrete time delay line delays the data by $r - 1$ clock cycles. The output of the delay line is controlled by a sync signal which suitably initializes the delay line at the beginning of a new message block.

The encoder in accordance with the invention replaces the r constant multipliers in the conventional parallel approach by a single general multiplier. All memory elements are lumped together in the single delay line. Since the delay line is implemented with a random access memory together with simple control logic, a significant reduction of hardware is realized due to the density of the RAM cells compared with registers as used in the conventional parallel encoder.

The invention and objects and features thereof will be more readily apparent from the following detailed description and appended claims when taken with the drawings.

DETAILED DESCRIPTION OF THE ILLUSTRATIVE EMBODIMENTS

Figure 1:
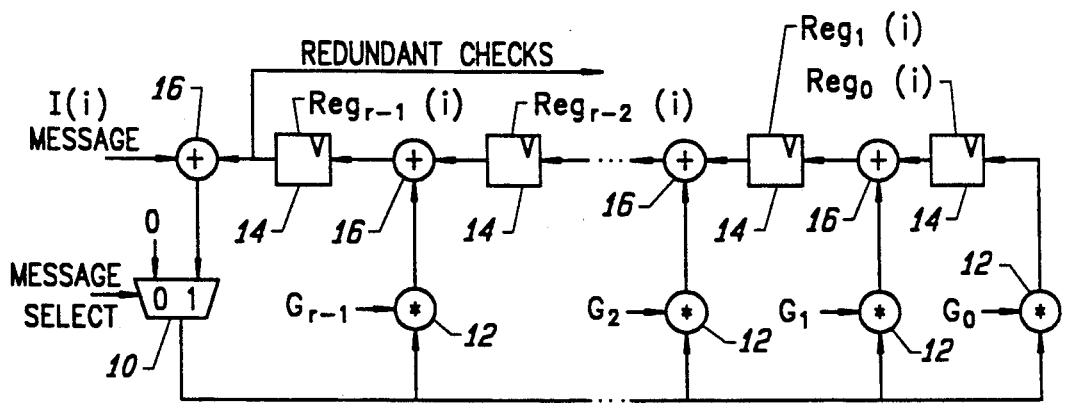
FIG. 1 is a schematic of a conventional parallel implemented RS encoder.
Figure 2:
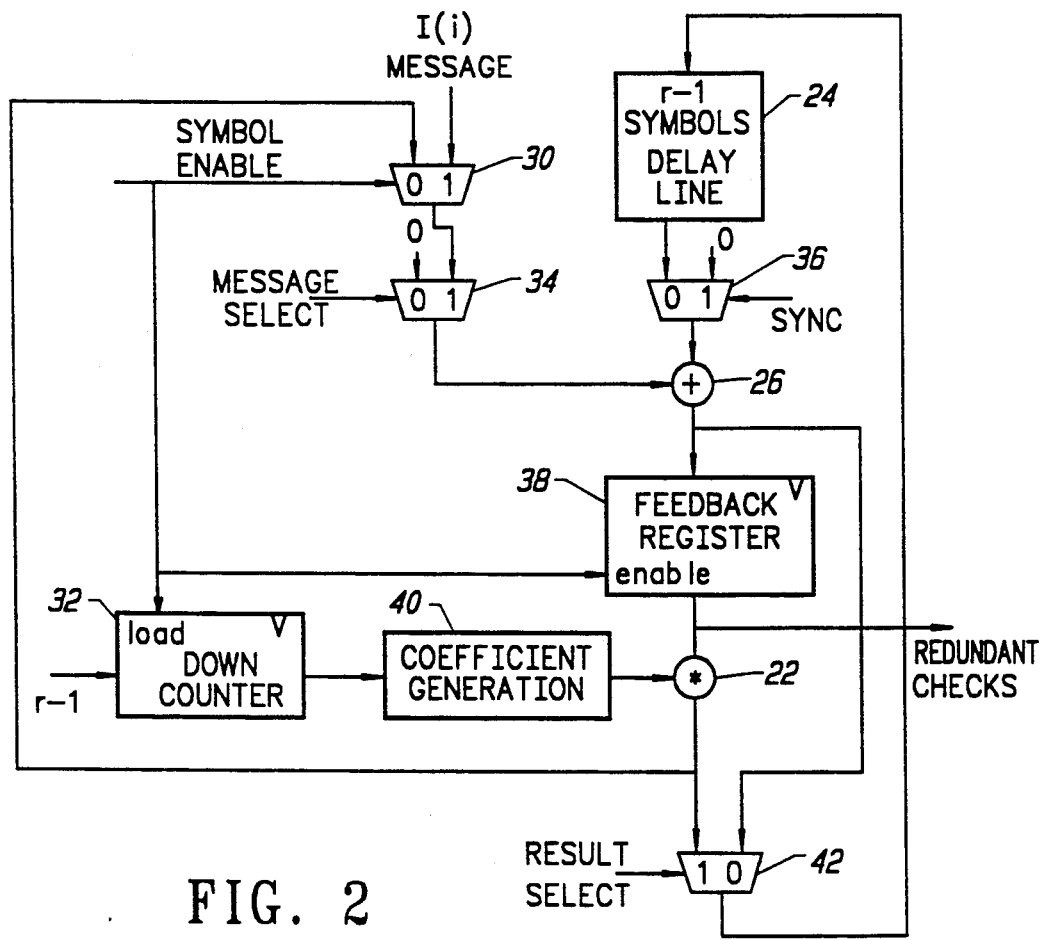
FIG. 2 is an RS encoder in accordance with one embodiment of the invention.

FIG. 2 is a schematic of a serial data RS encoder in accordance with one embodiment of the invention which utilizes a clock whose rate is r times the symbol or message input rate. The r constant multipliers 12 and the r finite field adder 16 in the conventional parallel encoder of FIG. 1 are replaced by a single general finite field multiplier 22 and a single finite field adder 26. A message symbol I(i) is input once every r clock cycles, and the r finite field multiplications and r finite field additions needed to process the input message symbol are performed in a sequential manner during the r available clock cycles. The order of the multiplications and additions is arranged so that nearly all memory elements (except for one symbol register) can be consolidated into a discrete time delay line of $r-1$ symbols. The consolidation of $r-1$ symbols of memory elements into single delay line represents a significant saving in circuit area since the delay line can be conveniently implemented by a simple control logic and a dense random access memory (RAM). Use of the RAM further alleviates the clock skew problem normally associated with the presence of a large number of registers.

The message I(i) is input through a mux 30 which is controlled by a symbol enable signal. The output of mux 30 is applied to a second mux 34 which is controlled by a message select control signal with the output of mux 34 being applied to adder 26. The other input to adder 26 comes from the $r-1$ symbols stored in the RAM delay line 24 which are applied through a mux 36 in response to sync control signals. The sum of each input message I(i) and a symbol from register 24 is stored in a feedback register 38 for sequential multiplication with the generator coefficients in multiplier 22. The generator coefficients can be generated from a read only memory 40 or by logic created by logic optimization software in response to the down counter 32. The check polynomial elements exit multiplier 22 through mux 42 and are stored in the $r-1$ symbol delay line 24 for subsequent operation. The redundant checks are stored and read out following completion of all computations.

Consider now the conventional parallel RS encoder of FIG. 1 and the operations required to process each input symbol. The input and registers are labelled with the time index i.

$Reg_{r-1}(i)$, $Reg_{r-2}(i)$, ..., $Reg_0(i)$ are the register contents when message symbol I(i) is being input. These registers are updated using the equations:

$$Reg_{r-1}(i + 1) = (I(i) + Reg_{r-1}(i))G_{r-1} + Reg_{r-2}(i)$$
$$Reg_{r-2}(i + 1) = (I(i) + Reg_{r-1}(i))G_{r-2} + Reg_{r-3}(i)$$

$$Reg_1(i + 1) = (I(i) + Reg_{r-1}(i))G_1 + Reg_0(i)$$
$$Reg_0(i + 1) = (I(i) + Reg_{r-1}(i))G_0$$

In the parallel approach, these computations are all performed in a single clock cycle. However, in the encoder of FIG. 2, the computations are performed in r clock cycles. The following equations show the order of the computations required to process the input symbols $I(i-1)$ and $I(i)$:

Cycle $ir - r - 1$: $Reg_{r-1}(i) = F(i - 1)G_{r-1} + Reg_{r-2}(i - 1)$
Cycle $ir - r$: $Reg_{r-2}(i) = F(i - 1)G_{r-2} + Reg_{r-3}(i - 1)$ Cycle $ir - 1$: $Reg_1(i) = F(i - 1)G_1 + Reg_0(i - 1)$,
Cycle $ir$: $Reg_0(i) = F(i - 1)G_0$, $F(i) = I(i) + Reg_{r-1}(i)$
Cycle $ir + 1$: $Reg_{r-1}(i + 1) = F(i)G_{r-1} + Reg_{r-2}(i)$
Cycle $ir + 2$: $Reg_{r-2}(i + 1) = F(i)G_{r-2} + Reg_{r-3}(i)$ Cycle $ir + r - 1$: $Reg_1(i + 1) = F(i)G_1 + Reg_0(i)$,
Cycle $ir + r$: $Reg_0(i + 1) = F(i)G_0$, $F(i + 1) =$
$$I(i + 1) + Reg_{r-1}(i + 1)$$

The computations for 2r cycles are shown to illustrate the interaction of computations for inputs $I(i-1)$ and $I(i)$. Note that during cycle ir, the following two computations are performed simultaneously:

(1) The computation of the register content $Reg_0(i)$ from the old feedback $F(i-1)$;

(2) The computation of the new feedback $F(i)$.

Note also that register content $Reg_j(i)$, after it is computed, is utilized again in the computation of $Reg_{j+1}(i+1)$ exactly $r-1$ cycles later. This is true for all $j = 0, 1, ..., r-1$.

Except for the control signals message select, symbol enable, sync and result select, all signals shown in the diagram are m bits wide (m being the number of bits per symbol). The circuit runs on a clock whose rate is r times the RS symbol rate, and a m-bit wide message symbol is input once every r clock cycles, controlled by the symbol enable signal which is high once every r clock cycles. The r multiplications associated with the input message symbol are performed sequentially, in the order $G_{r-1}, G_{r-2}, ..., G_1, G_0$, where the $G_i$'s are the coefficients of the generator polynomial. As noted above, these coefficients may be generated by a coefficient generation ROM (Read Only Memory), a RAM, or by logic created by logic optimization software. This allows the generator polynomial and the redundancy of the code by changed easily. The address of the RAM, ROM or the equivalent random logic is provided by a modulo r down counter. The counter is synchronized with the input message through the symbol enable signal, which is also used to enable the feedback register. The feedback register contains either the quotient or the remainder (the redundant check symbols) of the polynomial division, depending on whether all message symbols has been input. The intermediate results of the computation (the partial remainders of the division process) are directed back to a discrete-time delay line 24 through mux 42 controlled by the result select signal. The discrete-time delay line 24 delays the data by $r-1$ clock cycles. The output of the delay line is controlled by a sync signal which suitably initializes the delay line at the beginning of a new message block.

The circuit of FIG. 2 can be easily adapted to handle RS codes with interleaving. If the interleaving depth is d, the delay line is $rd-1$ symbols long. The delay line also conveniently allows the redundant check symbols to be output once every r clock cycles. This is done by appropriately re-circulating the $rd-1$ remaining check symbols through the delay line after the first check symbol has been output. The feedback register strobes the check symbols so that each of them is valid for r cycles.

It will be noted that the architecture of FIG. 2 differs from Berlekamp's bit-serial approach in that the serialization of computation is done over the aggregate of multiplications and additions. Each multiplication (and addition) itself is done in a parallel manner. In the bit-serial architecture, r multiplications and r additions are performed in parallel, but each multiplication (and addition) itself is simplified in a bit-serial manner. The invention can also be viewed as a microcoded sequencer architecture where the order of computation and data flow are arranged in an optimal manner to minimize the number of memory locations required and to simplify the sequencer. In the traditional microcoded sequencer approach, a RAM with at least r symbol locations is needed. Furthermore, additional registers are generally needed to store temporary intermediate results and to latch data at the input and output of the RAM to improve operation speed. The invention utilizes the minimum amount of memory. Any register situated at the input and output of the RAM for pipelining purpose can be regarded as part of the delay line and leads to a corresponding decrease in the size of the RAM. The addressing of the delay line is so simple and regular that the microcoded sequencer degenerates into a counter. The requirement for memory access speed can be lowered simply by using a RAM which is more than one symbol wide with appropriate multiplexing and de-multiplexing at the output and input of the RAM respectively. The number of memory accesses and the speed of the memory access cycle are bottleneck of the system.

Figure 3:
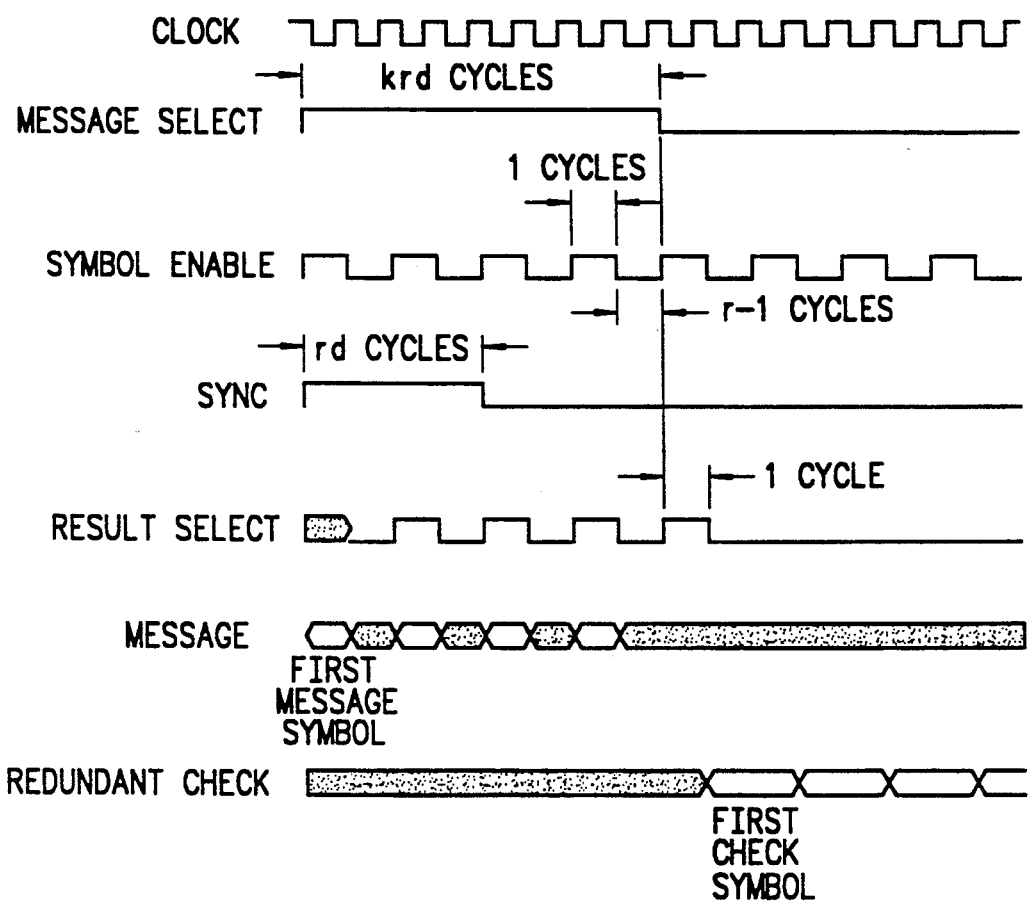
FIG. 3 is a timing diagram of control signals in the circuit of FIG. 2.

In addition to the above mentioned advantages, the architecture can be easily adapted for encoding RS codes with interleaving. For a RS encoder with interleaving depth d, the delay line is rd−1 symbols long, as noted above. Also, it can be easily re-configured for changes in the generator polynomial of the RS code, the amount of redundancy and the interleaving depth. As an illustration, the timing relationship of the various control signals for the case $k=2$, $r=2$, $d=2$ is depicted in FIG. 3.

The architecture has been used to implement a (180, 172) RS code over GF(256), interleaved to depth 3 (i.e. $k=172$, $r=8$, $d=3$, $m=8$). The VLSI design utilized a 1-micron CMOS technology. Approximately 1,000 gates of logic and a 10 by 16 RAM occupying an area of 0.3 square mm were used. The design was simulated at a system clock speed of 48 MHz for a throughput data rate of 6Mbytes per second. The system clock speed of 48 MHz is $r=8$ times the 6 MHz symbol rate.

The invention is also particularly suitable for the implementation of the error correction scheme specified by the ANSI X3B11 optical disk standard which specifies a (120, 104) RS code over GF(256), interleaved to depth 5 (i.e. $k=104$, $r=16$, $d=5$, $m=8$). A clock whose rate is $r=16$ times the symbol rate is needed. Such a clock is available in a typical optical disk system because the bit clock is 8 times the symbol clock, and the run length limited (RLL) data clock is 2 times the bit clock. In a typical optical disk system, the RLL code has rate ½; hence the modulated data clock is twice the unmodulated bit clock.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A serial Reed-Solomon data encoder for a code having n symbols including k message symbols and r redundant symbols, each symbol having m bits, comprising an adder having two inputs and an output, means for selectively applying m bits of a message symbol to one input of said adder, register means for selectively storing an output from said adder, a multiplier having two inputs and an output, means for applying the contents of said register means as one input to said multiplier, coefficient generator means for providing Reed-Solomon generator polynomial coefficients, means for applying coefficients from said coefficient generator means as another input to said multiplier, discrete time delay storage means for storing r−1 symbols and having an input and an output, means for selectively applying the output of said multiplier to said input of said discrete time delay storage means, means for applying said output of said discrete time delays storage means to the other input to said adder, means for selectively applying the output of said multiplier to said one input of said adder, means for selectively applying said output of said adder to said input to said discrete time delay storage means, and output means for redundant checks connected to the output of said register means, whereby an m bit message symbol is applied once every r clock cycles, and r additions and r multiplications are performed for every r clock cycles thereby serializing multiplications and additions in executing the Reed-Solomon code on each m bit message symbol.

2. The data encoder as defined by claim 1 wherein said means for selectively applying a message symbol to one input of said adder comprises a first multiplexer controlled by a symbol enable signal and a second multiplexer controlled by a message select signal, said means for selectively applying the output of said multiplier to said one input of said adder including said first multiplexer and said second multiplexer.

3. The data encoder as defined by claim 2 wherein said discrete time delay storage means comprises a random access memory.

4. The data encoder as defined by claim 3 wherein said coefficient generator means comprises a read only memory.

5. The data encoder as defined by claim 3 wherein said coefficient generator means comprises a random access memory.

6. The data encoder as defined by claim 3 wherein said coefficient generator means comprises logic optimization software.

7. The data encoder as defined by claim 3 wherein said message symbol is selected from interleaved Reed-Solomon codes with interleaving depth, d, said discrete time delay storage means being rd−1 symbols long.

8. The data encoder as defined by claim 7 wherein said message symbol is m-bits wide.

* * * * *